United States Patent [19]

Dalal

[11] 4,387,265
[45] Jun. 7, 1983

[54] TANDEM JUNCTION AMORPHOUS SEMICONDUCTOR PHOTOVOLTAIC CELL

[75] Inventor: Vikram L. Dalal, Newark, Del.

[73] Assignee: University of Delaware, Newark, Del.

[21] Appl. No.: 284,355

[22] Filed: Jul. 17, 1981

[51] Int. Cl.$^3$ ............................................. H01L 31/06
[52] U.S. Cl. ................................... 136/249; 136/258; 357/30
[58] Field of Search .................. 136/249 TJ, 258 AM; 357/30

[56] References Cited

U.S. PATENT DOCUMENTS

| | | | |
|---|---|---|---|
| 4,224,750 | 1/1981 | Chenevas-Paule et al. | 136/255 |
| 4,255,211 | 3/1981 | Fraas | 136/249 |
| 4,272,641 | 6/1981 | Hanak | 136/249 |
| 4,278,474 | 7/1981 | Blakeslee et al. | 136/249 |
| 4,292,461 | 9/1981 | Hovel | 136/249 |

OTHER PUBLICATIONS

G. Nakamura et al., "Amorphous SiGe:H for High Performance Solar Cells", *Japanese J. Appl. Phys.*, vol. 20 (1981), Supplement 20-1, pp. 291-296.

Y. Marfaing, "Evaluation of Multi-Junction Structures Using Amorphous Si-Ge Alloys", *Proceedings, Second European Community Photovoltaic Solar Energy Conference* (1979), Reidel Pub. Co. (1979), pp. 287-294.

T. Shimada et al., "Compositional & Structural Properties of Amorphous $Si_xC_{1-x}$:H Alloys Prepared by Reactive Sputtering", *J. Appl. Phys.*, vol. 50, pp. 5530-5532, (1979).

V. K. Dalal et al., "Design of Monolithic, Multiple-Gap, Amorphous Si-Ge Solar Cells", *Conf. Record, 14th IEEE Photovoltaic Specialists Conf.* (1980), pp. 1066-1069.

Primary Examiner—Aaron Weisstuch

[57] ABSTRACT

A photovoltaic stack comprising at least two $p^+i\ n^+$ cells in optical series, said cells separated by a transparent ohmic contact layer(s), provides a long optical path for the absorption of photons while preserving the advantageous field-enhanced minority carrier collection arrangement characteristic of $p^+i\ n^+$ cells.

24 Claims, 3 Drawing Figures

TANDEM JUNCTION AMORPHOUS SEMICONDUCTOR PHOTOVOLTAIC CELL

The Government of the United States of America has certain rights in this invention pursuant to Department of Energy Contract No. DE-AC03-79ET23034.

BACKGROUND OF THE INVENTION

Amorphous semiconductor materials, in particular silicon and germanium, have long been considered for use in photovoltaic devices, particularly in cells intended for converting solar energy into electricity. This is because of the lesser cost of these materials versus the very high cost of normally used highly purified crystal materials such as polycrystalline silicon. Crystalline silicon will hereinafter be called c-Si, as is usual in the field. Amorphous silicon cells, assembled by relatively inexpensive vapor deposition techniques, have been characterized by efficiencies of about 4–8%, whereas cells of c-Si have yielded efficiencies of up to about 18%, albeit at great cost.

Amorphous silicon, hereinafter called a-Si, is characterized by very short diffusion lengths for minority carriers, typically 0.1 $\mu$m. The consequence of this is that, conventional a-Si p+i n+cells cannot be made thick enough to absorb photons efficiently, although a-Si has a larger absorption coefficient than does c-Si, without sharply reducing the minority carrier collection efficiency. This occurs because such thicknesses substantially exceed the depletion length of the charge fields adjacent the p+i and n+i junctions of the cell. These charge fields are critical to efficient carrier collection, especially in a-Si cells.

Amorphous silicon, as the term is used herein, refers to the hydrogen-containing amorphous silicon material formed by glow discharge in silane as described by Carlson in U.S. Pat. No. 4,064,521. Optionally, the silicon may contain other elements such as fluorine, as taught by Ovshinsky et al. in U.S. Pat. No. 4,226,898. a-Ge is intended to mean analogous mixtures of germanium.

The problem of inefficient collection of minority carriers is recognized in the field and various solutions have been proposed. For example, Kressel et al. in U.S. Pat. No. 4,070,206 taught an a-Si tandem cell having an elongated optical path. The cell of Kressel et al has a stack comprising first and second layers and therebetween a third layer, the third layer being of opposite conductivity type to that of the others and having a thickness of at least twice the minority carrier diffusion length. Thus the cell has the p+n p+ or n+p n+configuration and the junctions are in optical series. Electrodes collect minority carriers in the region of the junctions and are connected in parallel.

The Kressel et al cell has not been widely adopted because of the need to place the electrodes very close together (see IEEE Trans. Electronic Devices, ED-27 no. 4 April 1980) because of the very high sheet resistance characteristic of a-Si and because the p+n junction in a-Si intrinsically has poor collection efficiency.

Chenevas-Paule et al addressed the same problem in U.S. Pat. No. 4,244,750 when they proposed a multilayer photovoltaic stack also characterized by a-Si junctions, in optical series, and transparent Schottky and ohmic contacts in parallel. Thus the proposed cell comprises a symmetrical arrangement of two basic photovoltaic stacks in optical series. Illustrative of the invention is a first basic stack comprising a semiconducting layer interposed between a supported lower layer forming a Schottky contact with said semiconductor layer, and a thin metal upper layer forming an ohmic contact with the same semiconductor layer. Sharing the same ohmic contact, a second basic stack of similar structure is placed on the first basic stack in reverse order to form complete cells. The two basic stacks may have different bandgaps whereby to capture a wider photon spectrum. The ohmic and Schottky contacts are connected in parallel and are semitransparent.

The Chenevas-Paule et al device would not function as well as would be desirable because minority carrier collection is not expected to be efficient, although it takes place in part within the depletion length of a charge field. This comes about because only one charge field, i.e., that field in the region of the Schottky-i junction, provides charge field assistance to minority carrier collection. Conventional two-junction cells of the p+i n+ type having, of course, two charge fields generally collect minority carriers more efficiently.

In providing the thin metal layer ohmic contact joining the cells, the designer has the problem of choosing good transparency and low sheet resistance, and at the same time, providing good ohmic or Schottky contact depending on the embodiment.

SUMMARY OF THE INVENTION

There is provided an a-Si and/or amorphous germanium (a-Ge) stack comprising two or more cells which, when employed in a photovoltaic device, is characterized by efficient minority carrier collection and sufficient optical thickness to absorb a large fraction of incident photons, the stack comprising, from bottom to top:

A first cell comprising:
 (a) an electrically conducting substrate;
 (b) a first doped semiconductor layer of a first conductivity type selected from a-Si, a-Ge, alone and in mixture;
 (c) an intrinsic layer of the semiconductor material of (b);
 (d) a second doped semiconductor layer of a second conductivity type, selected from a-Si, a-Ge, alone and in mixture;
 (e) a transparent or semitransparent ohmic contact layer;

A second cell sharing the ohmic contact (e), comprising:
 (f) a second doped semiconductor layer of a second conductivity type, selected from a-Si, and a-Ge, alone and in mixture;
 (g) an intrinsic layer of the semiconductor material of (f):
 (h) a first doped semiconductor layer of a first conductivity type selected from a-Si and a-Ge, alone and in mixture; and optionally, up to two further cells comprising the layers of the first cell and the second cell in the order respectively of the first cell and the second cell; and
 (i) means for collecting current.

DESCRIPTION OF THE PREFERRED EMBODIMENTS

Figure 1:
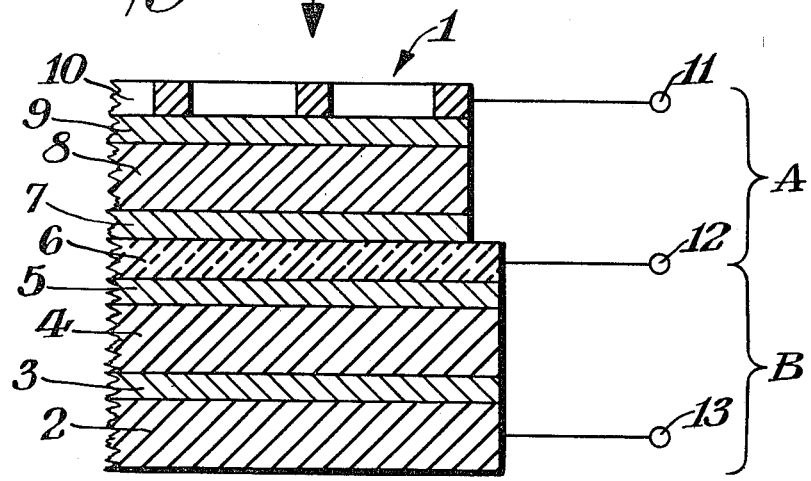
FIG. 1 is a cross sectional view showing schematically a photovoltaic stack of the invention comprising two cells in tandem and an arrow indicating a preferred direction of incident photons.

Exemplary of the invention is the two-cell stack of FIG. 1. Stack 1 is assembled on an electrically conducting substrate 2 serving as an ohmic contact. The substrate may be any of the kind normally used in the art, such as a sheet of any electrically conducting material such as metals, which are preferred, for example, stainless steel, gold, silver, aluminum, titanium, chromium and the like. It is preferred to employ a substrate which is reflecting, as is known, so as to reflect photons back which may have escaped capture on passage through stack.

Alternatively the substrate may be transparent so long as it is electrically conducting. For example, one might employ a glass support having thereon a transparent conducting oxide, such as indium tin oxide, to which electrical connection is made as is known in the art.

Such an arrangement permits the admission of light to the bottom of the stack, as well as to the top as indicated in FIG. 1. Should light be admitted only to the bottom of the stack, then an opaque current collector can, of course, be used at the upper end of the stack.

Deposited on substrate 2 is a first doped semiconductor layer 3 of a first conductivity type which may be amorphous germanium (a-Ge) or, as is preferred a-Si-, alone or mixed. Conductivity of the p+ type is preferred. Aluminum, gallium or preferably boron can be employed as dopants. On this layer is intrinsic layer 4 which comprises an undoped or lightly doped semiconductor of the same kind as in layer 3.

On i-layer 4 is a second doped semiconductor layer 5 of a second conductivity type which may be a-Ge, or, as is preferred, a-Si, alone or mixed. Conductivity is of the type opposite that of layer 3, thus preferably n+. Phosphorous dopant is preferred.

On layer 5 is a transparent or semitransparent ohmic contact 6. Layer 6 comprises art-known material and may be a thin conducting oxide such as pure or mixed oxides of indium and tin, optionally doped with fluorine or antimony or cadmium stannate. Indium tin oxide (ITO) is preferred. The layer may also be a thin deposit of metal such as titanium, chromium, platinum, palladium, tungsten, molybdenum alone or in mixture, or the like. The metal should not be so thick as to be opaque; approximately 50 Å thickness is preferred. Layer 6 may also be a large bandgap, heavily doped semiconductor of the same composition and conductivity as adjacent layers 5 and 7. Layer 6, which is shared between two cells, completes the cell labelled B in FIG. 1.

Cell A is preferably the same as cell B but not necessarily so, as will be explained, and is arranged in reverse or mirror order. Thus in a preferred embodiment, layer 7 is of the same conductivity type and bandgap as layer 5; layer 8 is of the same conductivity type and bandgap as is layer 4; and layer 9 is of the same conductivity type and bandgap as is layer 3. However, the thickness of the layers of cell A need not be the same as the corresponding layers of cell B. The prudent designer will limit the thickness of the heavily doped layers 7 and 9 to small values, say 100–300 Å, so as to limit light absorption losses in these layers.

In a variation also falling within the invention, the semiconductor of layers 7, 8, and 9 may be different from that of layers 3, 4, and 5. For example, the semiconductor of layers 7, 8, and 9 may be a-Si whereas the semiconductor of layers 3, 4, and 5 may be a mixture of a-Si and a-Ge, or a-Ge alone. Preferably the semiconductors of layers 3, 4, 5, 7, 8, and 9 consist largely of a-Si.

In order to more effectively to absorb incident radiation, the bandgap of layers 3, 4, and 5 (referred to as (b), (c), and (d) in the summary and claims) may be adjusted to be different from that of layers 7, 8, and 9 (referred to as (f), (g), and (h) in the summary and claims). When radiation comes from only one side, as is usual, those layers having the larger bandgap should be at that side of the stack receiving incident radiation. The bandgaps may be adjusted by methods known in the art.

In the invention embodiment wherein the substrate is transparent and light is admitted to the bottom of the stack, it is preferred to make the layers of cell B (FIG. 1) of a semiconductor material with a larger bandgap than in cell A of the same figure. Thus the layers of cell B can be made of a-Si and cell A of a-Ge.

The upper side of the stack, i.e., the side receiving photon radiation as represented in FIG. 1 by an arrow, has means for collecting current which may be a layer of a conducting oxide such as ITO or cadmium stannate or preferably is a metallic grid 10 as shown, composed, for example, of gold, silver, aluminum or the like, as is known in the art. Optionally one may employ both means. Not shown is an optional but usually employed encapsulation and antireflection coating.

Electrical contacts 11, 12, and 13 make electrical connection with grid 10, ohmic contact 6, and substrate 2 in a manner known in the art.

Although it is not preferred to do so, additional cells may be added to the stack so long as a transparent or semitransparent ohmic contact as described above is placed between cells, as will occur to the worker, skilled in the art.

Thus the stack of FIG. 1 as illustrated, inasmuch as it has two complete p+i n+ cells in optical series, has approximately twice the optical path of a single p+i n+ cell within which photons are absorbed. Each cell, unlike tandem cells of the art, has its own front and back charge fields associated with p+i and n+i junctions, thus preserving the advantageous field-enchanced minority carrier collection arrangement characteristic of p+i n+ cells. Stacks having three or four similarly arranged cells provide even longer optical paths and still retain the advantage of efficient carrier collection.

By employing a transparent ohmic contact layer 6 such as ITO, the high sheet resistance characteristic of a-Si is reduced to $10-20\Omega/\square$, while maintaining optical transmission between cells A and B at 98+%. Such low sheet resistance permits cell width of about 1 cm with little electrical loss.

Sheet resistance can also be reduced by employing in layer 6 a heavily doped high conductivity semiconductor. For example, in a stack wherein the cells are of p+i n+-n+i p+ type and the i-layers 4 and 8 have bandgaps of about 1.7 eV, the contact layer 6 might be a-Si about 1 μm thick, with a bandgap of ~2.0 eV, and be doped to confer on it n+ type conductivity and $\sigma > 20$ $(\Omega\text{-cm})^{-1}$. Such high bandgap material will permit most photons reaching it with energy of less than 2.0 eV, to pass into cell B for absorption therein. The sheet resistance of the contact layer 6 in this case would be only about 500Ω/□, thus allowing the designer to select a practical cell width of 3–4 mm.

Alternatively, the transparent ohmic contact layer 6 may be a sandwich of ITO between two thin metal layers. Such a sandwich provides good ohmic contacts, as is characteristic of metal/doped contacts, and the intermediate ITO reduces the sheet resistance characteristic of thin metals.

Figure 2:
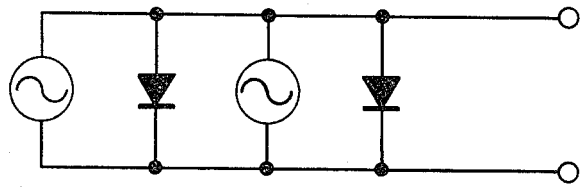
FIG. 2 shows an electrical equivalent circuit for the case where the outside contacts of FIG. 1 are common, thus placing the cells in parallel.
Figure 3:
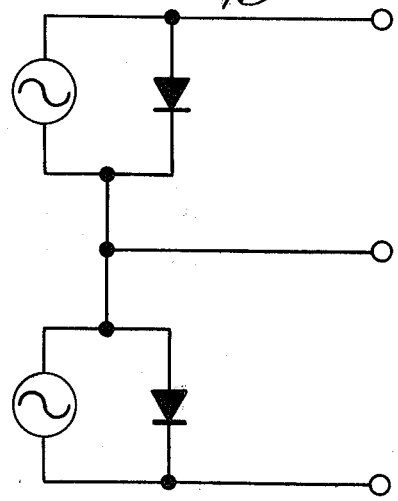
FIG. 3 shows an electrically equivalent circuit for the case where outside contacts of FIG. 1 are not common, thus leaving the cells isolated, permitting, for example, independent operation of each cell or series connection between different stacks.

As will be apparent to one skilled in the art, contacts 11, 12 and 13 can be connected to loads either in parallel or in isolation (i.e., in series), effectively to produce the electrically equivalent circuits of FIGS. 2 and 3 respectively.

When the cells are connected in parallel, care must be taken to ensure that the lower cell (cell B) provides a voltage more or less the same as that of the upper cell (cell A), because substantial inequality in voltage would cause one cell to drain current from the other.

Essential equality in voltage in the two cells is conveniently achieved by adjusting the doping as is known in the art, wherein the n+ and p+ layers of the lower cell are somewhat more heavily doped than are the corresponding layers of the upper cell. This stratagem increases the diffusion voltage of the lower cell more or less to that of the upper cell.

In the case where the contacts are connected in series (i.e. isolated), equality of voltage in the two cells is unimportant.

In general, the prudent designer would provide for a wider bandgap in the n+ and p+ layers than in the i layers. He would do this to minimize useless photon absorption in the n+ and p+ layers where there is little carrier collection in cells of the invention type. p+ and n+ layers of larger bandgap can be obtained, for example, by employing amorphous doped mixtures of silicon, carbon, and hydrogen, as is known in the art and hereinafter called a-(Si,C). The term a-Si, as used in claims, is intended to comprise this modification.

The use of a single transparent heavily doped junction layer in a single cell is known from Pankove, U.S. Pat. No. 4,109,271. However, in the instant invention, in order to assure maximum transmission of photons to the i layer of the second cell, it is preferred that the bandgap of both the doped layers (p+,n+) of each cell be larger than the corresponding i layers.

The stacks of the invention can be prepared by various combinations of methods of the art. For example, in a preferred embodiment, one might select reflecting stainless steel as the substrate and deposit thereon about a 1000 Å thick p+ layer of boron-doped a-Si by plasma decomposition of a mixture of $B_2H_6$ and $SiH_4$. An i-layer 500–5000 Å thick is deposited thereon in a similar manner by plasma decomposition of $SiH_4$ and on this, an n+ layer of phosphorous-doped a-Si about 100 Å thick is deposited by plasma decomposition of a mixture $PH_3$ and $SiH_4$. Completing the first cell, a transparent ohmic contact layer of 500–5000 Å thick ITO layer is deposited, for example, by electron beam evaporation of a mixture of $In_2O_3$ and $SnO_2$.

At this point the designer must consider how he is to provide for the connection of electrical leads to the ohmic contact layer of ITO just deposited. A common method provides for a setback of the following layers, as shown in FIG. 1, so as to leave free a small area on the ohmic contact layer for the installation of a bus bar, to which electrical leads are connected.

The simplest and preferred process for doing this employs a mask which prevents further deposition on the edge of the ohmic contact layer during the deposition of the upper cell layers.

In a less preferred embodiment, all layers of both cells are first assembled and material of the top cell is etched at the edge, down to the ITO contact layer. This can be done by masked sputter etching, with mass spectrographic monitoring of the process of the etching process, or by masked chemical etching using an aqueous mixture of $HNO_3$ and HF.

The width of the stack is selected to provide practical dimensions and to minimize series resistance in the connecting ITO ohmic contact layer. When ITO is used, cells of 1 cm width are practical. The properties of other materials will suggest other widths.

The stack is completed by installing a current collecting metallic grid or conducting oxide such as ITO. Electrical connections and an encapsulation-antireflection coating may be installed in the usual manner.

The invention has been illustrated with thin-film cells employing a-Si and a-Ge semiconductors. The invention is also applicable to other cells employing semiconductor materials such as $Cu_2S/CdS$, $CuInSe_2$ and the like wherein field-enhanced minority carrier collection is important or where wherein diffusion length of minority carriers is short. For example, it is known that the diffusion length of electrons in $Cu_2S$ is comparable to the diffusion length in a-Si (about 0.1 μm). It appears that the principles of this invention could be applied to such materials to produce efficient photovoltaic devices. For example, one might assemble a stack by joining two $Cu_2S$/CdS/Ohmic cells by means of a transparent ITO ohmic contact layer whereby to place the cells in optical series with consequent benefit in efficiency.

That which is claimed is:

1. A photovoltaic stack comprising, from bottom to top:
   a first cell comprising:
     (a) an electrically conducting substrate;
     (b) a first doped amorphous semiconductor layer of a first conductivity type overlying and in ohmic contact with said substrate;
     (c) a first intrinsic amorphous semiconductor layer overlying said first doped layer;
     (d) a second doped amorphous semiconductor layer of a second condutivity type overlying said first intrinsic layer;
     (e) a transparent or semitransparent third, heavily doped, high conductivity amorphous semiconductor layer of said second conductivity type overlying and in ohmic contact with said second doped amorphous semiconductor layer;
   a second cell overlying and in ohmic contact with said third doped amorphous semiconductor layer, comprising:
     (f) a fourth doped amorphous semiconductor layer of said second conductivity type overlying and in ohmic contact with said third doped amorphous semiconductor layer;
     (g) a second intrinsic amorphous semiconductor layer overlying said fourth doped layer;
     (h) a fifth doped amorphous semiconductor layer of said first conductivity type overlying said second intrinsic layer;

(i) an electrical contact layer overlying and in ohmic contact with said fifth doped layer;
means for collecting current comprising:
(j) a first ohmic electrical contact to said substrate;
(k) a second ohmic electrical contact to said third doped layer;
(l) a third ohmic electrical contact to said electrical contact layer.

2. The stack of claim 1 wherein the amorphous semiconductor layers are selected from hydrogen containing amorphous silicon, hydrogen containing amorphous germanium, and mixtures thereof.

3. The stack of claim 1 wherein the first intrinsic layer and the second intrinsic layer are hydrogen containing amorphous silicon.

4. The stack of claim 1 wherein at least one intrinsic layer is a mixture of hydrogen containing amorphous silicon and hydrogen containing amorphous germanium.

5. The stack of claim 1 wherein the first conductivity type is p+ and the second conductivity type is n+.

6. The stack of claim 1 wherein the first conductivity type is n+ and the second conductivity type is p+.

7. The stack of claim 1 wherein the electrically conducting substrate is a metal.

8. The stack of claim 1 wherein the electrically conducting substrate is selected from indium oxide and tin oxide, alone and in mixture, and cadmium stannate, supported on an insulator.

9. The stack of claim 8 wherein the insulator is transparent to light.

10. The stack of claim 1 wherein the transparent or semitransparent third doped amorphous semiconductor layer is a heavily doped semiconductor of the same composition as the adjacent layers and having a larger bandgap than those layers.

11. The stack of claim 1 having two cells.

12. The stack of claim 11 wherein the semiconductor layers of the first cell are of a-Ge and the semiconductor layers of the second cell are of a-Si.

13. The stack of claim 1 wherein the electrical contact layer comprises a metallic grid.

14. The stack of claim 1 wherein the electrical contact layer comprises a conducting layer selected from indium oxide and tin oxide, alone and mixed, and cadmium stannate, in combination with a metallic grid.

15. The stack of claim 1 wherein the doped amorphous semiconductor layers in at least one cell are characterized by a bandgap larger than that of the intrinsic layer of the same cell.

16. The stack of claim 15 wherein at least one doped amorphous semiconductor layer of the first conductivity type is a-(Si,C).

17. The stack of claim 15 wherein at least one doped amorphous semiconductor layer of the second conductivity type is a-(Si,C).

18. The stack of claim 1 where the bandgap of the amorphous semiconductor layers of the first cell is different from the bandgap of the amorphous semiconductor layers of the second cell.

19. The stack of claim 1 wherein the bandgap of the first intrinsic amorphous semiconductor layer is less than the bandgap of the second intrinsic amorphous semiconductor layer.

20. The stack of claim 1 wherein the bandgap of the first intrinsic amorphous semiconductor layer is larger than the bandgap of the second intrinsic amorphous semiconductor layer.

21. The stack of claim 1 wherein the voltage of the first cell is essentailly equal to the voltage of the second cell.

22. The stack of claim 1 wherein the doped layers of the first cell are more heavily doped than are the doped layers of the second cell so as to adjust the diffusion voltage of the first cell with respect to the second cell.

23. The stack of claim 1 wherein the third doped amorphous semiconductor layer is hydrogen containing amorphous silicon and is characterized by n+ doping, electrical conductivity greater than twenty reciprocal ohmcentimeters, bandgap of two electron volts and thickness of one micrometer.

24. The stack of claim 1 wherein the first and third ohmic contacts are electrically joined, forming a first electrical output, and the second ohmic contact forms a second electrical output contact of a tandem parallel connected photovoltaic stack.

* * * * *